(12) United States Patent
Lin

(10) Patent No.: US 9,397,277 B2
(45) Date of Patent: Jul. 19, 2016

(54) LED PACKAGES AND MANUFACTURING METHOD THEREOF

(71) Applicants: LITE-ON ELECTRONICS (GUANGZHOU) LIMITED, Guangzhou (CN); LITE-ON TECHNOLOGY CORP., Taipei (TW)

(72) Inventor: Chen-Hsiu Lin, Taipei (TW)

(73) Assignees: Lite-On Electronics (Guangzhou) Limited, Guangzhou (CN); Lite-On Technology Corp., Taipei (TW)

( * ) Notice: Subject to any disclaimer, the term of this patent is extended or adjusted under 35 U.S.C. 154(b) by 0 days.

(21) Appl. No.: 14/203,766

(22) Filed: Mar. 11, 2014

(65) Prior Publication Data

US 2014/0284641 A1   Sep. 25, 2014

(30) Foreign Application Priority Data

Mar. 22, 2013   (CN) .......................... 2013 1 0095063

(51) Int. Cl.
| | | |
|---|---|---|
| H01L 21/48 | (2006.01) | |
| H01L 33/60 | (2010.01) | |
| H01L 33/52 | (2010.01) | |
| H01L 33/36 | (2010.01) | |
| H01L 21/78 | (2006.01) | |
| H01L 33/00 | (2010.01) | |
| H01L 23/00 | (2006.01) | |
| H01L 25/16 | (2006.01) | |
| H01L 33/48 | (2010.01) | |

(52) U.S. Cl.
CPC ................ *H01L 33/60* (2013.01); *H01L 21/78* (2013.01); *H01L 24/97* (2013.01); *H01L 33/0095* (2013.01); *H01L 33/36* (2013.01); *H01L 33/52* (2013.01); *H01L 25/167* (2013.01); *H01L 33/486* (2013.01); *H01L 2224/48091* (2013.01); *H01L 2224/48227* (2013.01); *H01L 2924/12035* (2013.01); *H01L 2924/12041* (2013.01)

(58) Field of Classification Search
CPC ......... H01L 33/50; H01L 33/54; H01L 33/60; H01L 33/52; H01L 33/56; H01L 33/36; H01L 21/78; H01L 21/784; H01L 21/4867; H01L 2924/12041; H01L 24/97
See application file for complete search history.

(56) References Cited

U.S. PATENT DOCUMENTS

| | | | | |
|---|---|---|---|---|
| 7,442,564 | B2 * | 10/2008 | Andrews | ........................ 438/26 |
| 8,093,619 | B2 * | 1/2012 | Hayashi | ................ H01L 33/486 257/100 |
| 2008/0048203 | A1 * | 2/2008 | Son | ................................ 257/98 |
| 2009/0224271 | A1 * | 9/2009 | Seo | ........................ H01L 33/483 257/98 |
| 2012/0098006 | A1 * | 4/2012 | Chen et al. | ...................... 257/98 |
| 2013/0001604 | A1 * | 1/2013 | Shimonishi et al. | ............ 257/88 |
| 2013/0236996 | A1 * | 9/2013 | Chen et al. | ...................... 438/27 |

* cited by examiner

*Primary Examiner* — Michael Trinh
(74) *Attorney, Agent, or Firm* — Rosenberg, Klein & Lee

(57) ABSTRACT

A method of manufacturing LED packages includes the steps of: forming a conductive circuit layer on a substrate; screen printing a wall layer on the conductive circuit layer to form a trellis with a plurality of wall units, so that regions of the conductive circuit layer surrounded by the wall units are exposed; mounting and electrically connecting at least one LED die on the conductive circuit layer within each of the wall units; molding a transparent layer to cover the LED dies; and cutting along the wall units to form a plurality of LED packages.

8 Claims, 13 Drawing Sheets

LED PACKAGES AND MANUFACTURING METHOD THEREOF

CROSS-REFERENCE TO RELATED APPLICATION

This application claims priority of Chinese Patent Application No. 201310095063.5, filed on Mar. 22, 2013.

BACKGROUND OF THE INVENTION

1. Field of the Invention

This invention relates to a LED package and a manufacturing method thereof, more particularly to a LED package having a reflector and a manufacturing method thereof.

2. Description of the Related Art

Referring to FIG. 1, in addition to forming a plastic reflector on a conventional lead frame by means of an injection molding process so as to increase the reflectivity of a light emitting diode (LED) die, a conventional way to enhance the luminous efficiency of an LED is disclosed in U.S. Pat. No. 7,687,292, which involves mounting LED dies 92 on a substrate 91, followed by forming a fluorescent colloid layer 93 by means of a molding process, and then cutting the fluorescent colloid layer 93 to produce grooves 94, followed by another molding process to form a white silicone wall 95 so as to enhance the reflection effect. Finally, a plurality of LED packages are formed by means of a cutting process. However, multiple molding processes result in a greater wearing of the cutters and a higher cost. In addition, an uneven appearance of the interface between the fluorescent colloid layer 93 and the white silicone wall 95 caused by cutting burrs is likely to be generated due to the cutting processes. This results in an easy invasion of moisture or peeling, arising in a poor product yield.

SUMMARY OF THE INVENTION

Therefore, an object of the present invention is to provide a method of manufacturing LED packages that may alleviate the problem of cutting burrs attributed to cutting a fluorescent colloid layer.

Another object of the present invention is to provide an LED package made by the method of this invention.

Since a wall layer is formed on a substrate by virtue of a screen printing process in the present invention, only a single molding process is required after LED dies are mounted, thereby reducing the number of cutting steps and wearing of cutters, and improving upon the adhesion and peeling problems attributed to cutting burrs in the prior art. Therefore, invasion of moisture may be effectively prevented, and a highly reliable product having superior airtight property may be obtained.

BRIEF DESCRIPTION OF THE DRAWINGS

Other features and advantages of the present invention will become apparent in the following detailed description of the preferred embodiments of this invention, with reference to the accompanying drawings, in which.

DETAILED DESCRIPTION OF THE PREFERRED EMBODIMENTS

Figure 1:
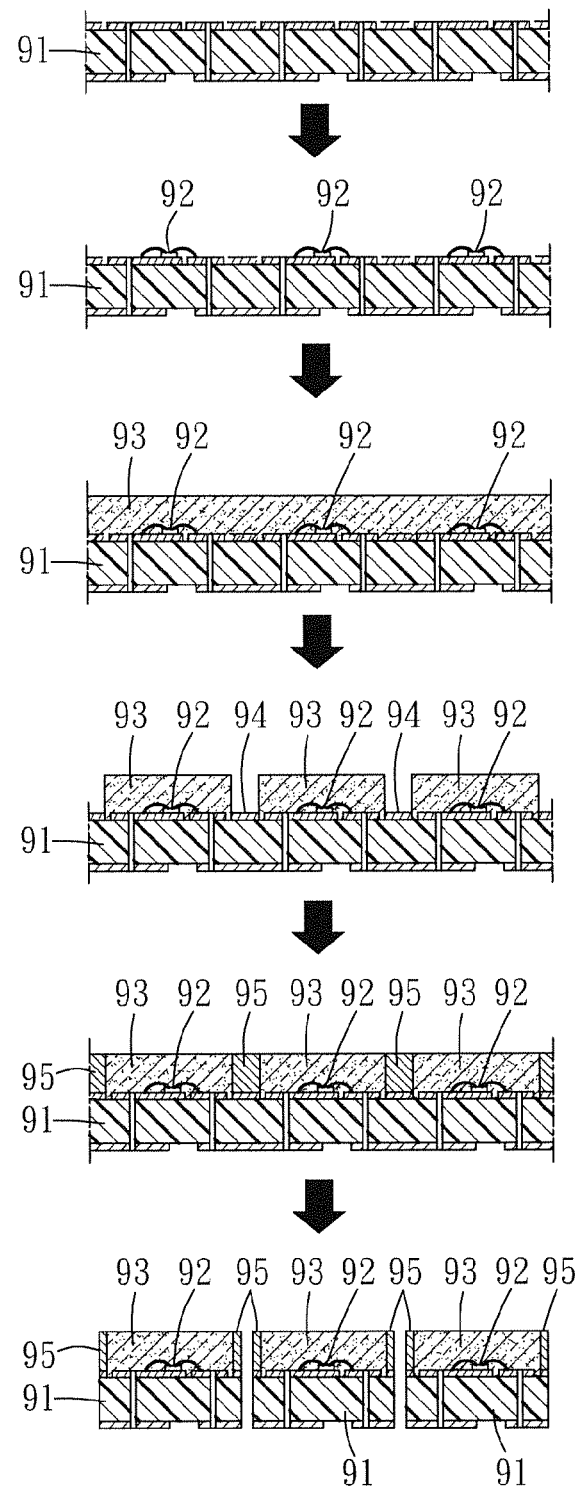
FIG. 1 illustrates consecutive steps of manufacturing LED packages of a conventional method.

Before the present invention is described in greater detail, it should be noted that like components are assigned the same reference numerals throughout the following disclosure.

Figure 2:
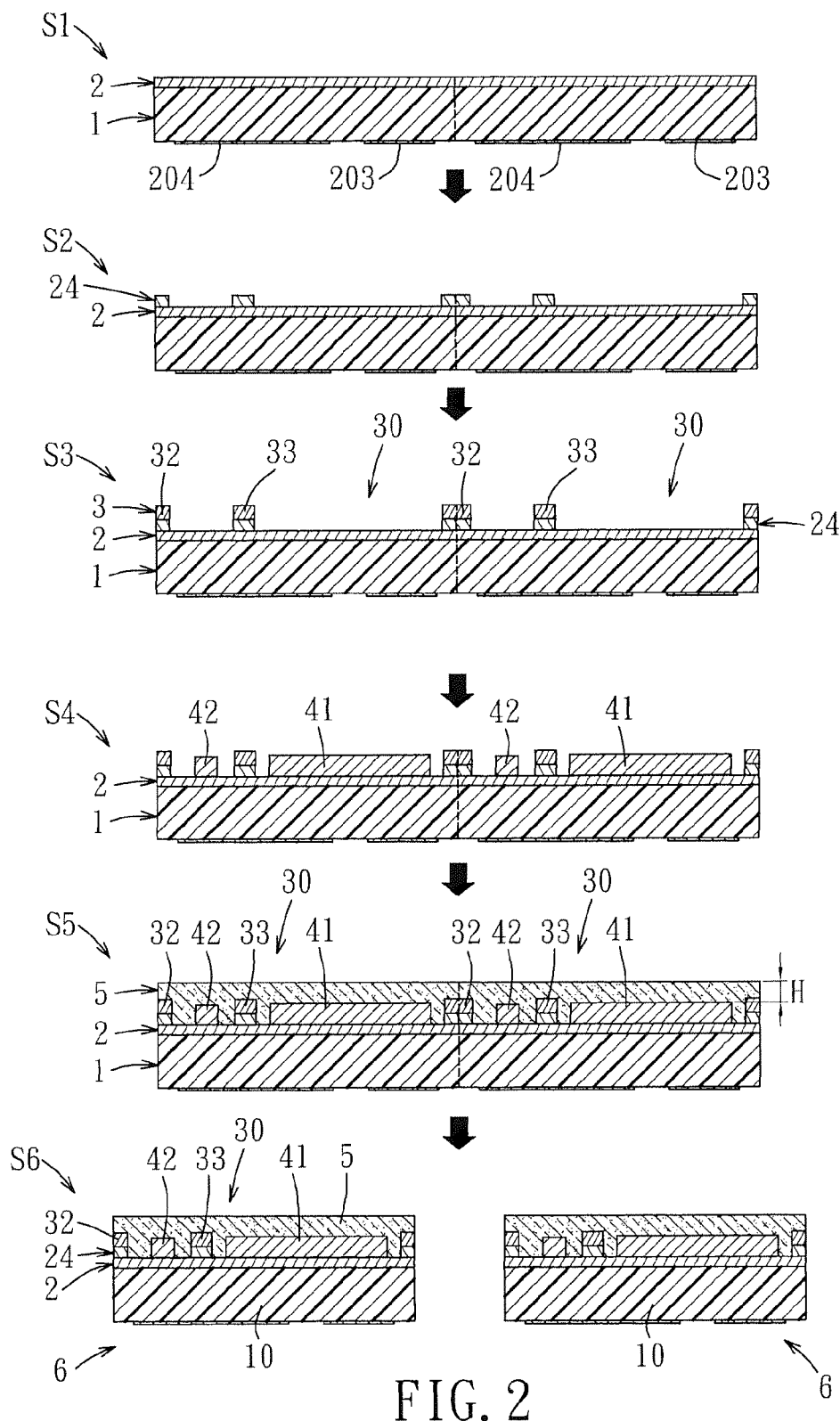
FIG. 2 illustrates consecutive steps of a method of manufacturing LED packages of a first preferred embodiment according to the present invention.
Figure 3:
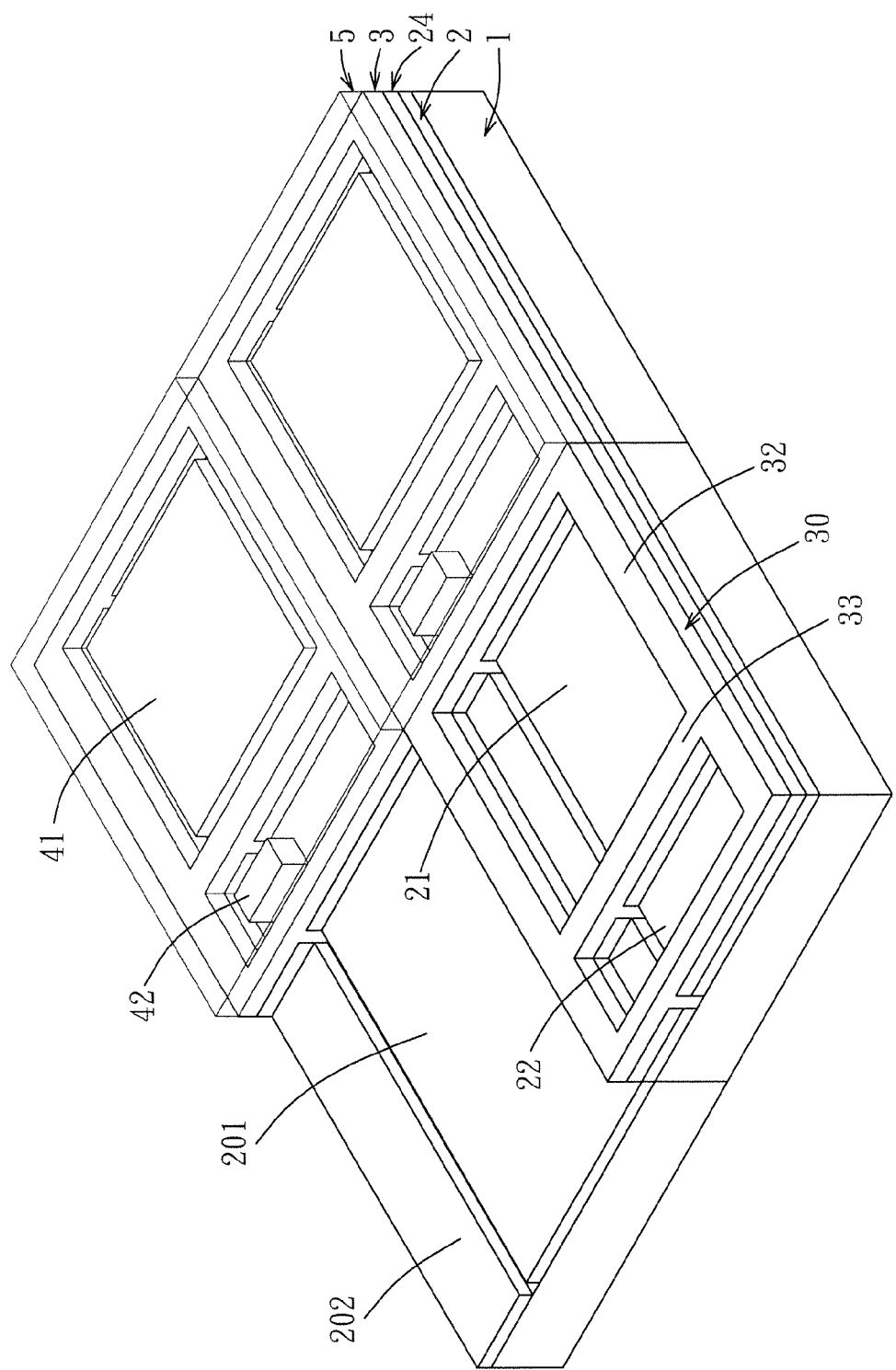
FIG. 3 is a schematic perspective view illustrating a state before a cutting step of the first preferred embodiment.
Figure 4:
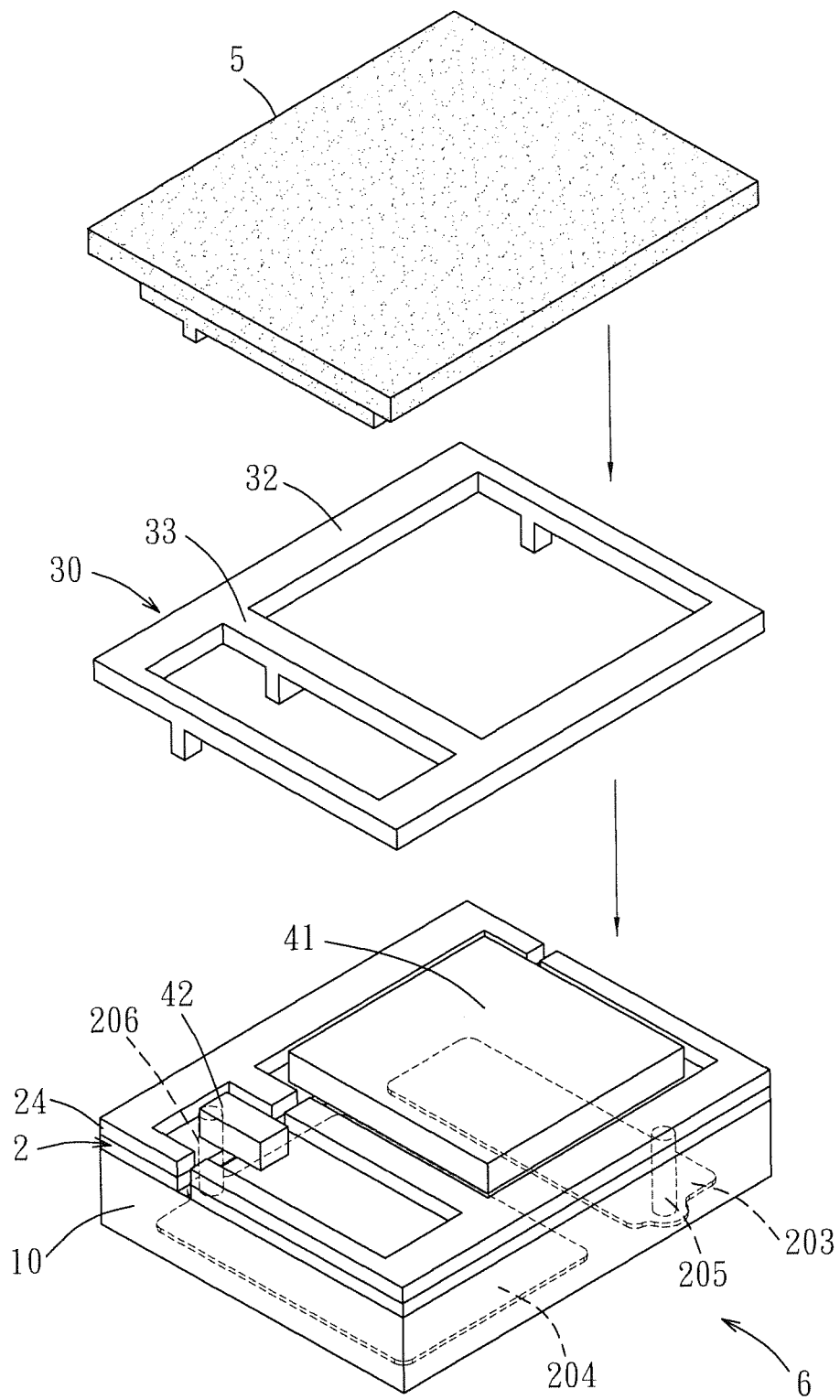
FIG. 4 is a schematic exploded perspective view illustrating an LED package made by the first preferred embodiment.

Referring to FIGS. 2 to 4, a method of manufacturing LED packages of a first preferred embodiment according to the present invention comprises steps S1 to S6.

In step S1, a conductive circuit layer 2 is formed on a substrate 1. In this embodiment, the conductive circuit layer 2 is formed by means of a copper-plating process and is formed such that the upper surface of the substrate 1 is provided with a plurality of positive and negative electrodes 201, 202. A plurality of solder pads 203, 204 are formed on the lower surface of the substrate 1 in the same manner. In addition, a plurality of through holes are provided beforehand at specific positions of the substrate 1. The through holes are filled with copper during the copper-plating process to form a plurality of conductive pillars 205, 206 (only one conductive pillar 205 and one conductive pillar 206 are shown in FIG. 4). The conductive pillars 205, 206 are provided for connecting correspondingly the positive and negative electrodes 201, 202 of the conductive circuit layer 2 to the solder pads 203, 204.

In step S2, a stepped structure 24 is first formed on a region where a wall layer 3 (to be described hereinafter) is to be formed. The stepped structure 24 is similarly formed by means of the copper-plating process on the above mentioned regions of the conductive circuit layer 2, so that the stepped structure 24 projects from the conductive circuit layer 2.

In step S3, an opaque wall layer 3 is formed on the stepped structure 24 by means of a screen printing process, and the wall layer 3 is a trellis so as to form a plurality of wall units 30. Therefore, the regions of the conductive circuit layer 2 respectively surrounded by the wall units 30 are exposed. In this embodiment, each of the wall units 30 has a frame portion 32 and a partition portion 33 so as to define a first mounting area 21 and a second mounting area 22 in each of the regions of the conductive circuit layer 2. The wall layer 3 made of highly reflective white silicone or ink is screen printed on the stepped structure 24. The highly reflective white silicone or ink preferably has a reflectivity of more than 80%. After the screen printing process, the wall layer 3 is then subjected to heat treatment. The wall layer 3 facilitates the reflection of light of LED dies 41 to enhance the light output of the LED package. In this embodiment, the while silicone with a trade name "SWB-4501" is used, and the heat treatment is performed preferably at 150° C. for 2 hours. In other embodiments, a photo-imageable solder resist ink with a trade name "PSR-4000 WT03" is used, and the heat treatment is performed preferably at 150° C. for 1 hour. In addition to high reflectivity, non-color changeable property is also a main consideration for selection of the reflective materials. The parameters of heat treatment are dependent on the respective materials, and are not limited to those mentioned above.

In step S4, an LED die 41 is mounted and electrically connected to the first mounting area 21 on the conductive circuit layer 2 within each of the wall units 30, and a Zener diode 42 is mounted and connected electrically to the second mounting area 22. The electrical connections between the LED dies 41 and the positive and negative electrodes 201, 202 of the conductive circuit layer 2 may be established by a direct contact using a flip chip technique or by wires using a wire bonding technique.

In step S5, a transparent colloid layer 5 is formed By means of a molding process so that the transparent colloid layer 5 covers the LED dies 41 and the Zener diodes 42 and is disposed on the conductive circuit layer 2. The transparent colloid layer 5 may be formed of a transparent resin mixed with a fluorescent powder. Alternatively, the transparent colloid layer 5 may be only made of a transparent resin, and the surface of the LED dies 41 is covered with a fluorescent powder before the molding process is performed. In other embodiments, the material selection of the transparent colloid layer 5 (e.g. white silicone) can be considered only if the light can be transmitted and invasion of moisture can be isolated. The vertical height H between the top face of the transparent colloid layer 5 and the top face of the LED dies 41 is preferably 150 μm, such that light from the LED dies 41 can be sufficiently light-mixed in the transparent resin mixed with the fluorescent powder. Therefore, an enhanced light-mixing effect can be achieved.

The transparent colloid layer 5 should at least cover the LED dies 41, so that the light from the LED dies 41 is transmitted through the transparent colloid layer 5 and reflected by the wall layer 3 and then exits the transparent colloid layer 5 in a direction away from the substrate 1. In this embodiment, the area corresponding to the whole substrate 1 is covered with the transparent colloid layer 5. That is, not only are the LED dies 41 covered with the transparent colloid layer 5, but the top surface of the wall layer 3 is also covered with the transparent colloid layer 5.

In step S6, by cutting along the frame portions of the wall units 30 to form a plurality of LED packages 6, the substrate 1 is also cut correspondingly to form a plurality of plate members 10. Therefore, the LED packages 6 are only cut during the last process to form individual parts, and no cutting process is performed on the interface of the transparent colloid layer 5 and the wall layer 3. In this way, for example, adhesion and peeling problems attributed to cutting burrs may be avoided. Therefore, invasion of moisture may be effectively prevented, and a highly reliable product with superior airtight property may be obtained.

Referring to FIGS. 3 and 4, an LED package 6 made by the first preferred embodiment comprises a plate member 10, a conductive circuit layer 2, two solder pads 203, 204, two conductive pillars 205, 206, a stepped structure 24, a wall unit 30, a LED die 41, a Zener diode 42, and a transparent colloid layer 5.

The plate member 10 is formed of an insulative material. The conductive circuit layer 2 is formed on the plate member 10 and is formed of an electrically conductive material, and has spaced apart positive and negative electrodes 201, 202 in the form of blocks. The two solder pads 203, 204 are spaced apart from each other and are disposed on the bottom face of the plate member 10. The conductive pillars 205, 206 extend downwardly and respectively from the positive and negative electrodes 201, 202 of the conductive circuit layer 2 through the plate member 10 and are connected respectively to the solder pads 203, 204 so as to electrically connect the positive and negative electrodes 201, 202 to the solder pads 203, 204, respectively. Accordingly, the solder pads 203, 204 can be directly welded to a circuit board (not shown), that is, the positive and negative electrodes 201, 202 can be electrically connected to the circuit board.

The stepped structure 24 is formed between the conductive circuit layer 2 and the wall unit 30, and is formed of a material the same as that of the conductive circuit layer 2, which is copper in this embodiment. The wall unit 30 is made of a highly reflective white silicone or ink, and has a frame portion 32 and a partition portion 33 so as to define a first mounting area 21 and a second mounting area 22 in the conductive circuit layer 2.

The LED die 41 is mounted and electrically connected to the first mounting area 21, and the Zener diode 42 is mounted and electrically connected to the second mounting area 22. In this embodiment, the LED die 41 and the Zener diode 42 are in direct contact with and electrically connected to the positive and negative electrodes 201, 202 by virtue of a flip-chip technique. However, the LED die 41 and the Zener diode 42 may be electrically connected to the positive and negative electrodes 201, 202 by wires using a wire bonding technique in other embodiments of the invention.

The transparent colloid layer 5 may be formed of a transparent resin mixed with a fluorescent powder. The transparent colloid layer 5 covers the wall unit 30 and the region surrounded thereby. Namely, the transparent colloid layer 5 covers the frame portion and the partition portion so as to encapsulate the LED die 41 and the Zener diode 42. The surrounding region includes the LED die 41, the Zener diode 42 and the portions where the conductive circuit layer 2 are exposed. In this way, the light from the LED die 41 is transmitted through the transparent colloid layer 5, reflected by the frame portion 32 and the partition portion 33, and then exits the transparent colloid layer 5 in a direction away from the plate member 10.

In addition, by the configuration of that the top face of the wall unit 30 is higher than the top face of the LED die 41, and the configuration of that the LED die 41 is spaced apart from the frame portion 32 and the partition portion 33, the reflection of the light of the LED die 41 around by the frame portion 32 and the partition 33 can be facilitated. Blocking the Zener diode 42 from the LED die 41 by means of the partition portion 33 may also reduce the light absorption effect of the Zener diode 42. In addition, since the wall unit 30 is formed using a screen printing process, the corners of the wall unit 30 will be round corners rather than right angle (i.e., an angle of 90 degrees) corners.

Figure 5:
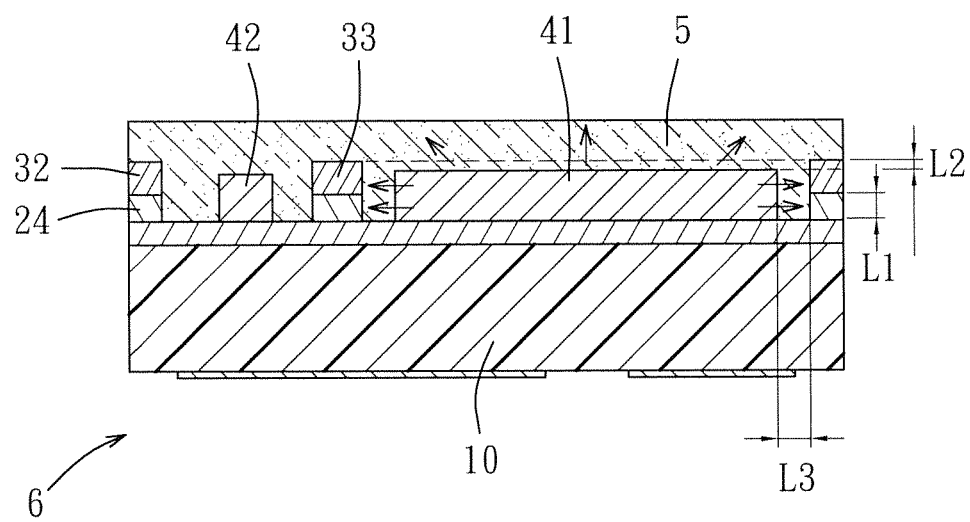
FIG. 5 is a schematic sectional view illustrating the LED package made by the first preferred embodiment.
Figure 6:
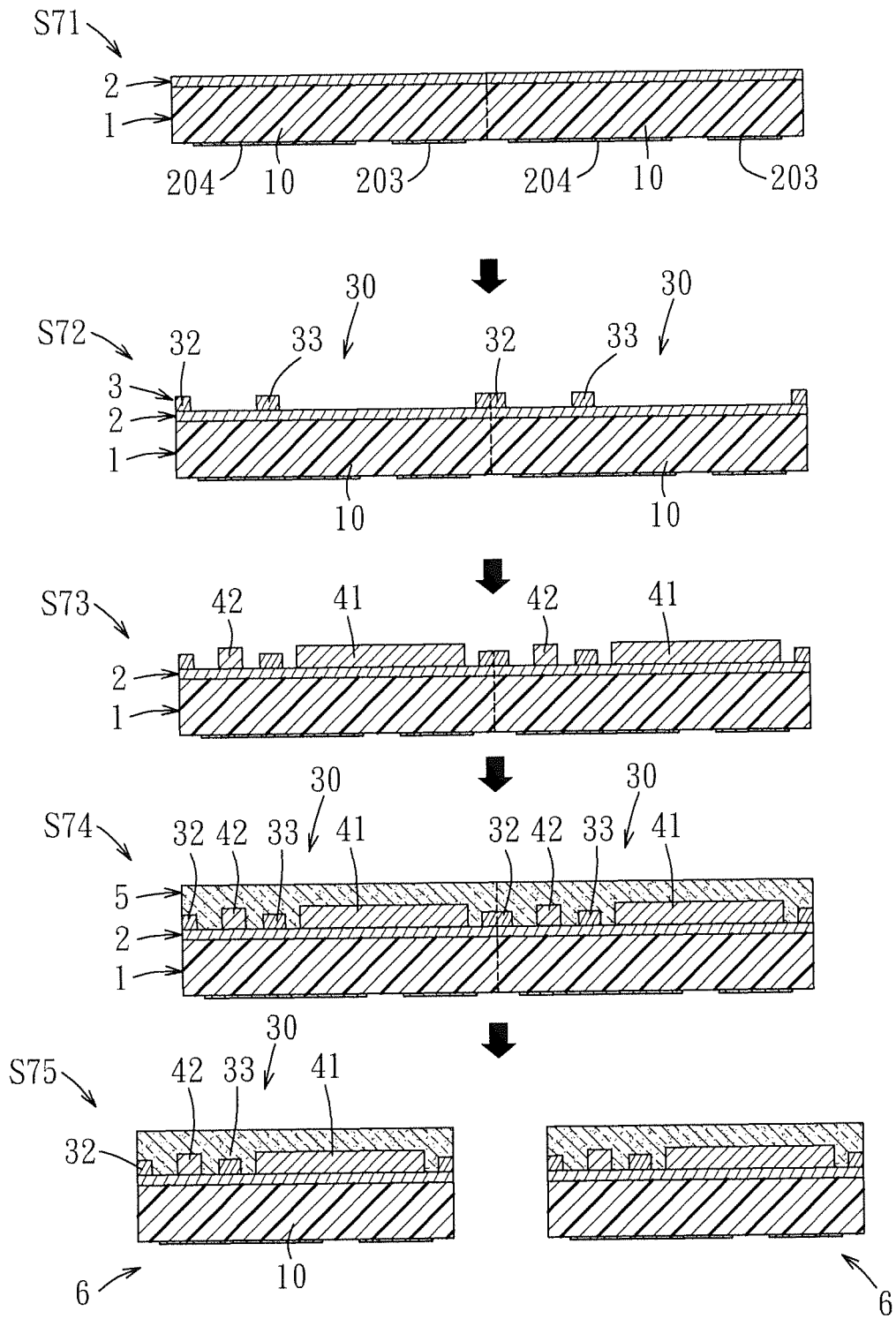
FIG. 6 illustrates consecutive steps of a second preferred embodiment of a method of manufacturing LED packages according to the present invention, in which a stepped structure is omitted.
Figure 7:
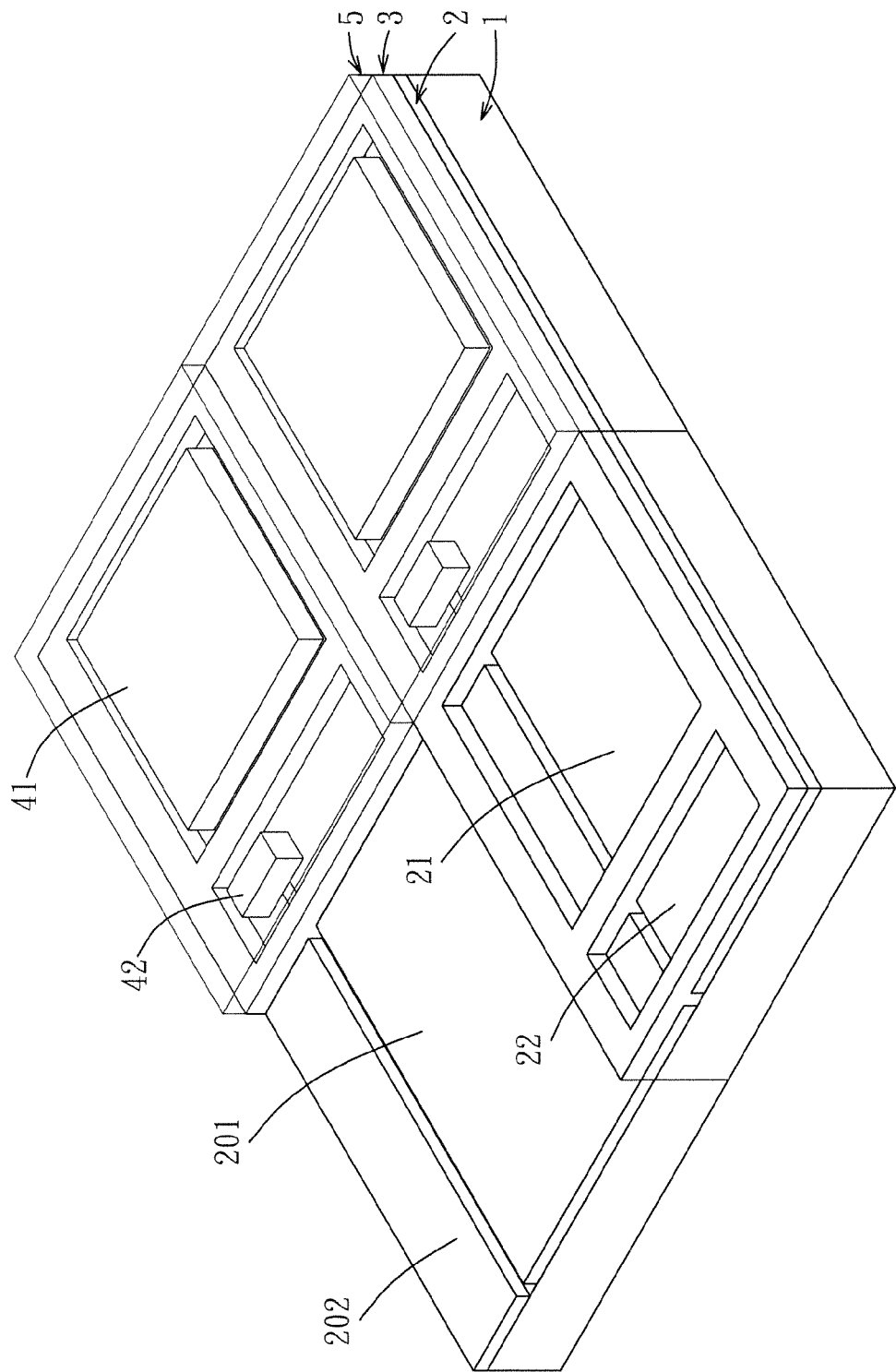
FIG. 7 is a schematic perspective view illustrating a state before a cutting step of the second preferred embodiment.
Figure 8:
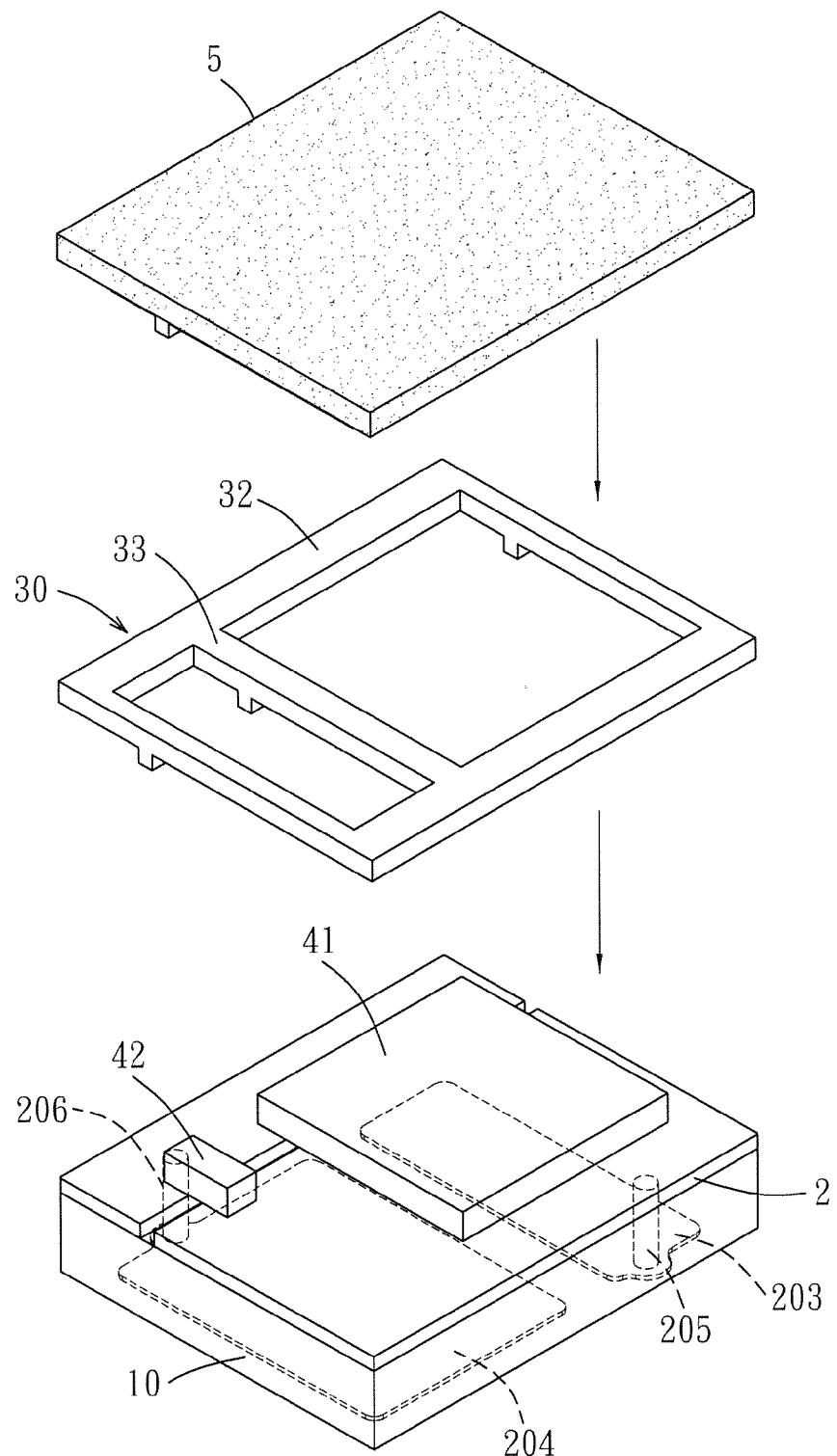
FIG. 8 is a schematic exploded perspective view illustrating an LED package made by the second preferred embodiment.

Referring to FIG. 5, in this embodiment, the height L1 of the stepped structure 24 is about 100 to 200 μm, and the height L2 that is defined by a distance between the top face of the LED die 41 and the top face of the wall unit 30 is about 25 to 100 μm. The height L2 is equal to: (the height L1 of the stepped structure)+(the height of the wall unit)−(the height of the LED die). More particularly, the height of the LED die 41 is larger than the height L1 of the stepped structure 24. The distance L3 between the LED die 41 and the wall unit 30 is about 150 to 500 μm. However, the dimensions L1, L2, L3 may be adjusted as desired, and are not limited to those described herein. In addition, the interface between the wall unit 30 and the stepped structure 24 is preferably positioned at ⅔ of the height of the LED die 41, that is, the height L1 is preferably equal to ⅔ of the height of the LED die 41, so that the LED package 6 has an improved light extraction efficiency. The propagation directions of the light are indicated by the arrows shown in FIG. 5.

Referring to FIGS. 6 to 9, a method of manufacturing LED packages and an LED package 6 made thereby according to a second preferred embodiment of the present invention are shown to be generally similar to the first preferred embodiment, except that the stepped structure 24 (see FIG. 2) is omitted in the second preferred embodiment. That is to say, in view of the steps of the manufacturing method, step S2 (see FIG. 2) is omitted from steps S71 to S75 illustrated in FIG. 6 as compared to the first preferred embodiment. Therefore, the wall layer 3 is formed directly on the conductive circuit layer 2, and a plurality of wall units 30 are formed. As to the LED package 6, in the second preferred embodiment, the wall unit 30 is formed directly on the conductive circuit layer 2 while the transparent colloid layer 5 covers the wall unit 30, the LED die 41, the Zener diode 42 and the portions where the conductive circuit layer 2 are exposed.

Figure 9:
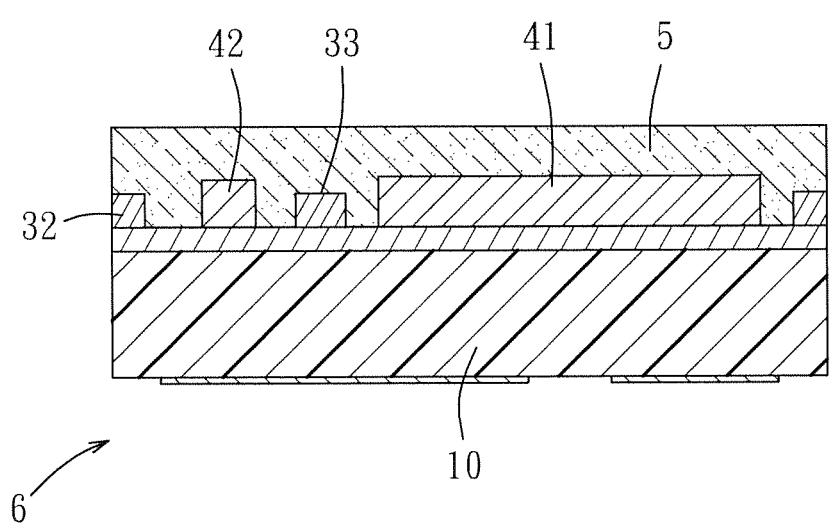
FIG. 9 is a schematic sectional view illustrating the LED package made by the second preferred embodiment.

Under the thickness restriction of a screen printing technique, the total height of the wall unit 30 is lower than the heights of the LED die 41 and the Zener diode 42 in the case in which the stepped structure 24 is not included (as shown in FIG. 9). That is, the top faces of the wall units 30 are lower than the top faces of the LED die 41 and the Zener diode 42. However, in this embodiment, the wall units 30 still have an effect of reflecting the light emitted from the LED die 41.

Figure 10:
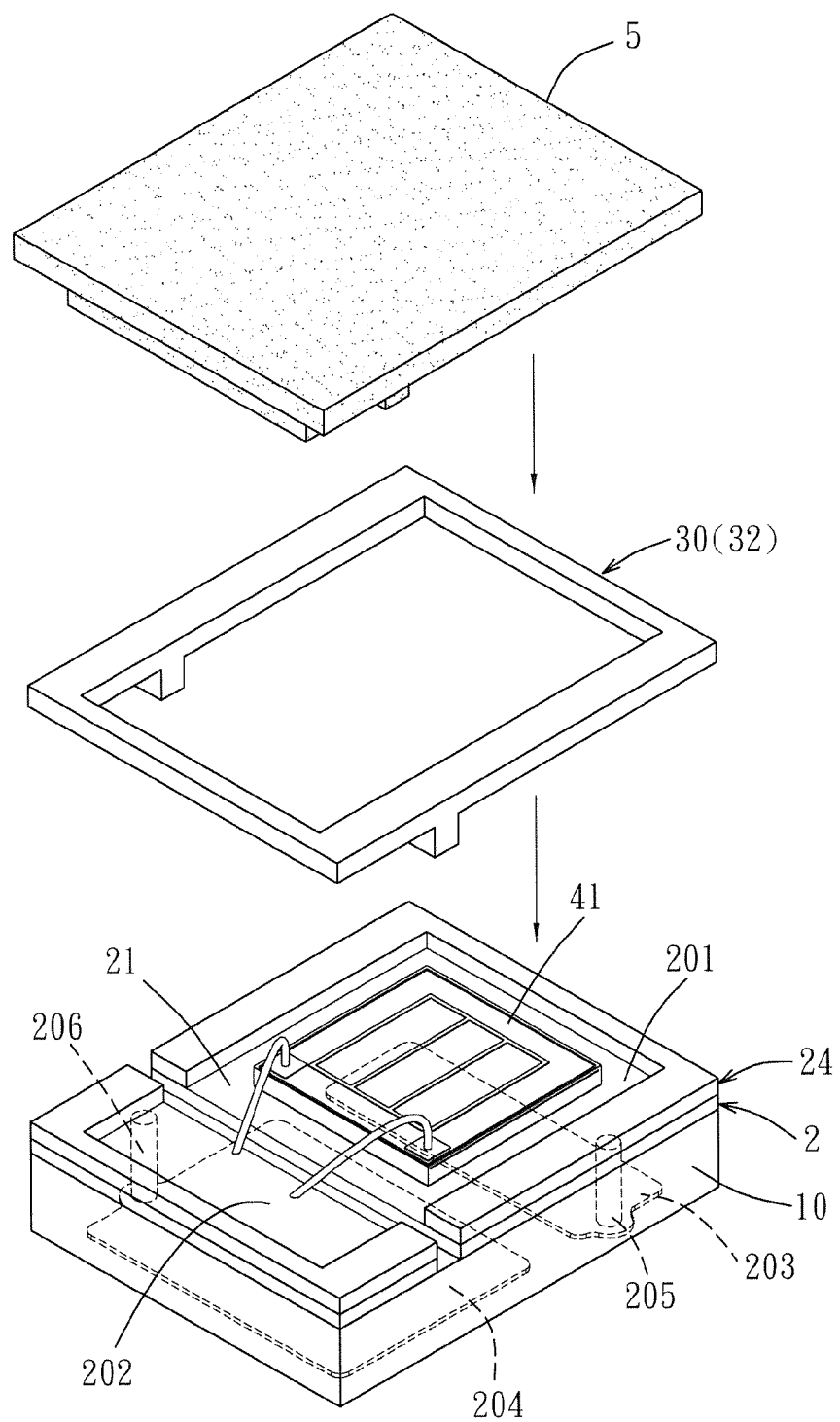
FIGS. 10 to 12 illustrate a method of manufacturing LED packages of a third preferred embodiment according to the present invention, in which a vertical LED die is used.
Figure 11:
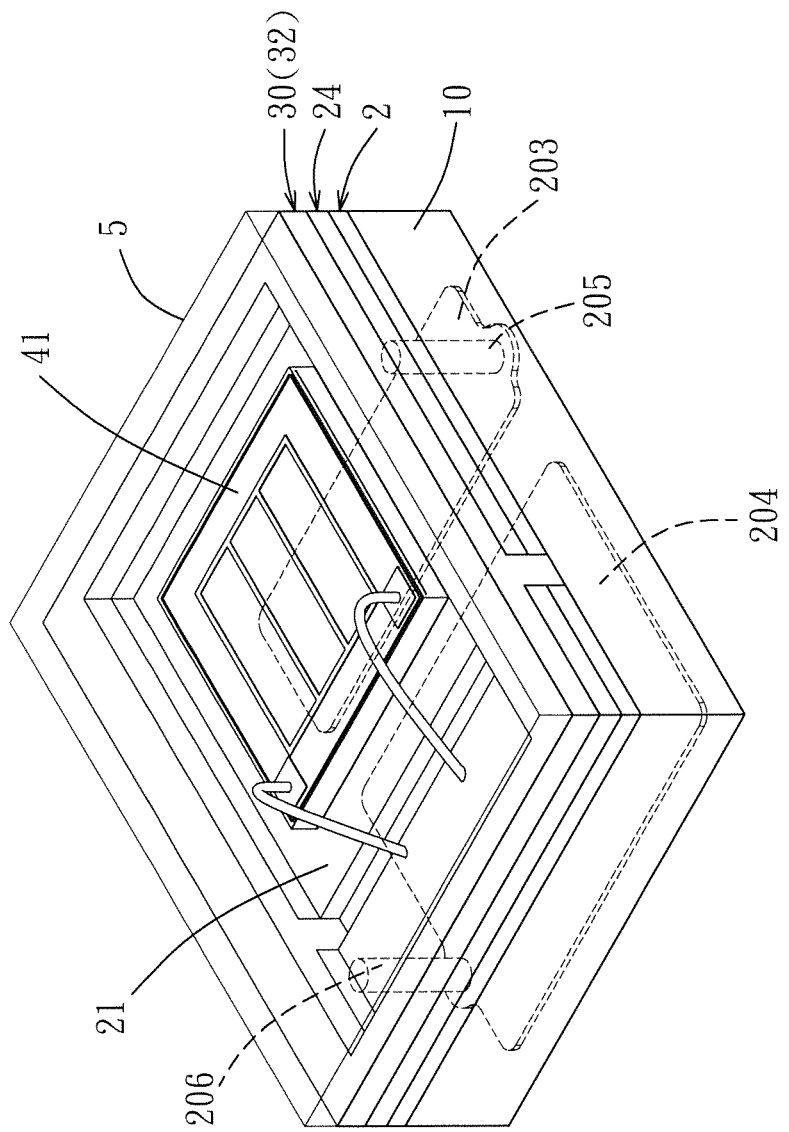

Referring to FIGS. 10 and 11, a method of manufacturing LED packages and an LED package 6 made thereby according to a third preferred embodiment of the present invention are shown to be generally similar to the first preferred embodiment, except that each of the wall units 30 only has an frame portion 32, and does not have a partition portion 33 (see FIG. 4). Therefore, only one first mounting area 21 is defined in the conductive circuit layer 2. In addition, in this embodiment, the Zener diode 42 is omitted. Further, a vertical LED die is used as the LED die 41. The bottom electrode of the vertical LED die is in direct contact with and electrically connected to the positive electrode 201 of the conductive circuit layer 2, and the top electrode of the vertical LED die is electrically connected to the negative electrode 202 by means of a wire bonding technique. Similarly, the positive and negative electrodes 201, 202 are electrically connected to the solder pads 203, 204 through conductive pillars 205, 206, respectively.

Figure 12:
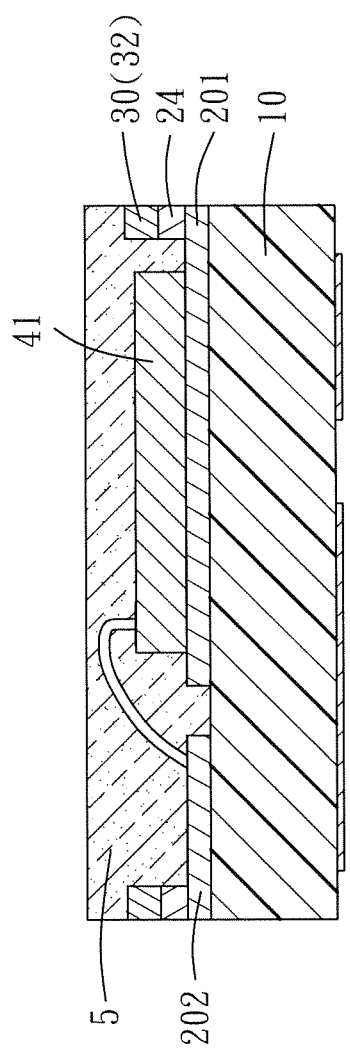

Referring to FIG. 12, it is noted that, in the present invention, since the stepped structure 24 and the wall layer 3 are formed respectively using the electroplating and screen printing processes, the total height of the stepped structure 24 and the wall layer 3 may be lower than the height of the wires. In other words, a total height of the stepped structure 24 and the wall layer 3 is lower than a top point of the wire. Therefore, when the transparent colloid layer 5 is provided using a molding process, the total height of the stepped structure 24, the wall layer 3 and the transparent colloid layer 5 must be larger than the total height of the LED die and the wires in order to prevent exposure of the wires from the LED package.

Figure 13:
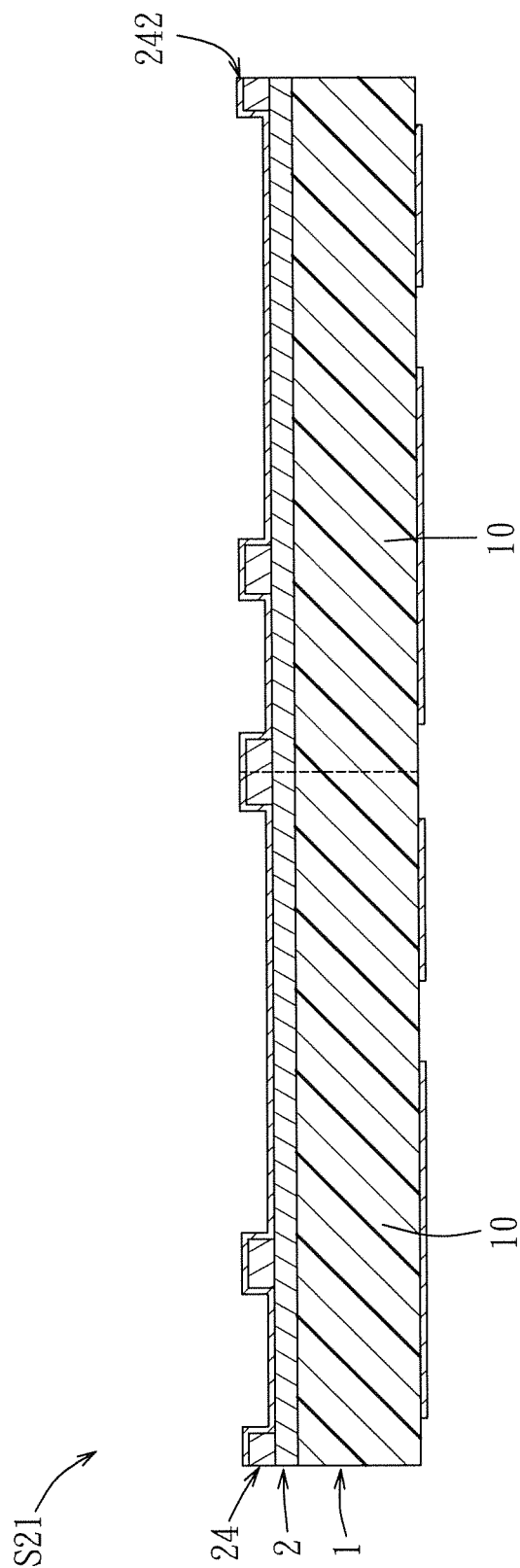
FIG. 13 is a schematic sectional view illustrating a step of forming a highly reflective layer of a method of manufacturing LED packages of a fourth preferred embodiment according to the present invention.

Referring to FIGS. 2 and 13, a method of manufacturing LED packages and an LED package 6 made thereby according to a fourth preferred embodiment of the present invention are shown to be generally similar to the first preferred embodiment, except that after the steps S1, S2 of forming the conductive circuit layer 2 and the stepped structure 24 on the substrate 1, a step S21 is further performed to electroplate a highly reflective layer 242, for example, nickel, silver, etc., on the conductive circuit layer 2 and the stepped structure 24 in order to further facilitate the reflection of the light of the LED die 41. It is also noted that the step S21 may be implemented in combination with the abovementioned embodiments to facilitate the reflection of the light in the respective embodiments.

To sum up, since the highly reflective wall layer 3 is formed on the substrate 1 by virtue of a screen printing process, only a single molding process is required after the LED dies are mounted, thereby reducing the number of the cutting steps and the wearing of the cutters, and improving upon the adhesion and peeling problems attributed to cutting burrs in the prior art. Therefore, invasion of moisture may be effectively prevented, and a highly reliable product having superior airtight property may be obtained.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. A method of manufacturing LED packages, comprising the steps of:
   forming a conductive circuit layer on a substrate;
   screen printing a wall layer on the conductive circuit layer to form a trellis with a plurality of wall units, so that regions of the conductive circuit layer correspondingly surrounded by the wall units are exposed;
   mounting and electrically connecting at least one LED die on the conductive circuit layer within each of the wall units;
   molding a transparent layer to cover the LED dies; and
   cutting along the wall units to form a plurality of LED packages.

2. The method of manufacturing LED packages as claimed in claim 1, further comprising a step of forming a stepped structure on a region of the conductive circuit layer where the wall layer is to be formed so that the wall layer is formed on the stepped structure.

3. The method of manufacturing LED packages as claimed in claim 2, wherein a total height of the stepped structure and the wall layer is greater than a height of the LED die.

4. The method of manufacturing LED packages as claimed in claim 2, wherein the conductive circuit layer and the stepped structure are formed of a same material.

5. The method of manufacturing LED packages as claimed in claim 2, further comprising the step of covering a highly reflective layer on surfaces of the stepped structure and the conductive circuit layer, the highly reflective layer having a reflectivity of more than 80%.

6. The method of manufacturing LED packages as claimed in claim 1, wherein each of the wall units has a frame portion and a partition portion so as to define a first mounting area and a second mounting area in the conductive circuit layer, the LED die being mounted to the first mounting area, the method further comprising the step of mounting and electrically connecting a Zener diode to the second mounting area.

7. The method of manufacturing LED packages as claimed in claim 6, wherein the transparent layer is disposed on the frame portion and the partition portion to cover the LED dies and the Zener diode.

8. The method of manufacturing LED packages as claimed in claim 1, before the step of forming the transparent layer, further comprising a step of disposing a fluorescent material on the LED die or mixing a fluorescent material into said transparent layer.

\* \* \* \* \*